(12) United States Patent
Do (10) Patent No.: US 7,643,356 B2
(45) Date of Patent: Jan. 5, 2010

(54) SEMICONDUCTOR MEMORY DEVICE HAVING INPUT DEVICE

(75) Inventor: Chang-Ho Do, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 198 days.

(21) Appl. No.: 12/005,545

(22) Filed: Dec. 27, 2007

(65) Prior Publication Data

US 2009/0003089 A1 Jan. 1, 2009

(30) Foreign Application Priority Data

Jun. 27, 2007 (KR) .................... 10-2007-0063743

(51) Int. Cl.
*G11C 5/14* (2006.01)

(52) U.S. Cl. .................... 365/189.09; 365/189.05; 365/189.07

(58) Field of Classification Search ............ 365/189.09, 365/189.05, 189.07, 189.08, 189.11, 230.08
See application file for complete search history.

(56) References Cited

U.S. PATENT DOCUMENTS

| | | | |
|---|---|---|---|
| 5,912,899 A | 6/1999 | Kim et al. | |
| 6,947,336 B2* | 9/2005 | Kim et al. | 365/189.05 |
| 7,148,721 B2* | 12/2006 | Park | 326/30 |

FOREIGN PATENT DOCUMENTS

| | | |
|---|---|---|
| JP | 11-144461 | 5/1999 |
| JP | 11-238399 | 8/1999 |
| JP | 2001-014845 | 1/2001 |
| JP | 2002-246891 | 8/2002 |
| JP | 2004-253072 | 9/2004 |
| KR | 10-2001-0019753 A | 3/2001 |
| KR | 10-2004-0006937 A | 1/2004 |

* cited by examiner

*Primary Examiner*—Dang T Nguyen
(74) *Attorney, Agent, or Firm*—Blakely, Sokoloff, Taylor & Zafman LLP (57) ABSTRACT

A semiconductor memory device includes a pad for receiving an external signal through a first external pin, a reference voltage pad for receiving an external reference voltage through a second external pin, an internal reference voltage generator configured to generate an internal reference voltage using an external voltage in response to a reference voltage select signal, a reference voltage supply unit for generating the reference voltage select signal in response to a plurality of select signals, and selecting one reference voltage between the external reference voltage and the internal reference voltage to output the selected one as a reference voltage, a buffer for converting an output signal of the pad into an internal voltage level on the basis of the reference voltage, and a signal selector for controlling an internal signal to be inputted/outputted through the reference voltage pad in response to the plurality of select signals.

20 Claims, 6 Drawing Sheets

FIG. 8

SEMICONDUCTOR MEMORY DEVICE HAVING INPUT DEVICE

CROSS-REFERENCE TO RELATED APPLICATIONS

The present invention claims priority to Korean patent application number 10-2007-0063743 filed on Jun. 27, 2007, which is incorporated by reference in its entirety.

BACKGROUND OF THE INVENTION

The present invention relates to semiconductor design technology, and more particularly to a semiconductor memory device having an input device.

In general, semiconductor memory devices include contacts, e.g., pads, for receiving a variety of external signals or outputting signals. The minimum number of pads required by semiconductor memory devices depends on the number of types of signals and externally supplied voltages which are defined in their specifications. Additionally, semiconductor memory devices generally include additional pads used for testing. These additional pads are used for monitoring internally generated voltages of the semiconductor devices or applying internal signals from the outside.

Hereinafter, an input device having pads in a semiconductor memory device, which receives/outputs signals, will be described in detail.

Figure 1:
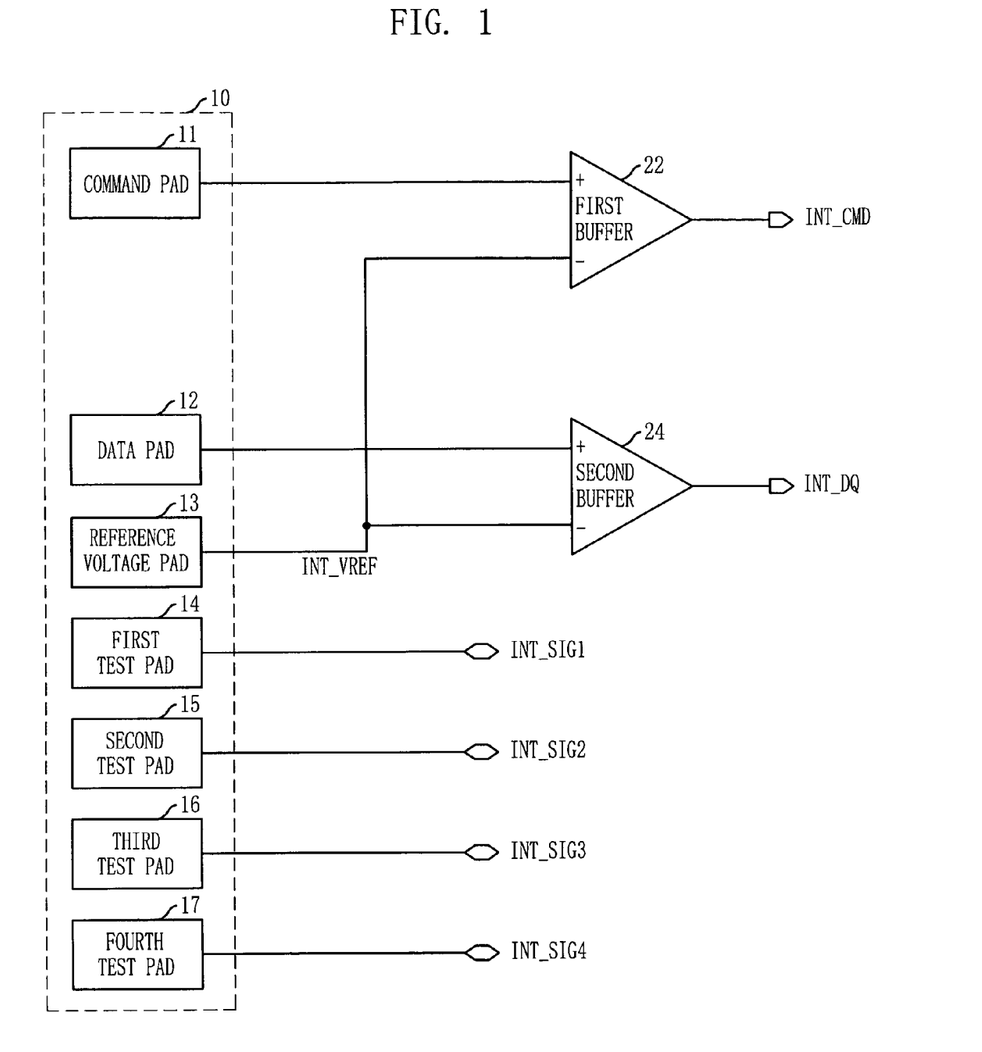
FIG. 1 illustrates a block diagram of a conventional semiconductor memory device having an input device.

FIG. 1 illustrates a block diagram of a conventional semiconductor memory device having an input device.

Referring to FIG. 1, the conventional semiconductor memory device includes a command pad 11, a data pad 12, a reference voltage pad 13, a first buffer 22, a second buffer 24, and first to fourth test pads 14, 15, 16 and 17. The command pad 11 receives a command through an external pin. The data pad 12 receives/outputs data through an external pin, and the reference voltage pad 13 receives a reference voltage through an external pin. The first buffer 22 converts an output signal of the command pad 11 into an internal command INT_CMD having an internal voltage level on the basis of the reference voltage VREF. The second buffer 24 converts an output signal of the data pad 12 into an internal data INT_DQ having an internal voltage level on the basis of the reference voltage VREF. The first to fourth test pads 14, 15, 16 and 17 receive test signals from the outside.

Typically, the pads of the semiconductor memory device are classified into general pads 11, 12 and 13 and test pads 14, 15, 16 and 17. Here, the general pads 11, 12 and 13 input/output a signal through an external pin even after the device has been packaged. The test pads 14, 15, 16 and 17 are used for applying a signal or monitoring an internal signal only during a wafer test. Examples of the general pad include pads for inputting/outputting commands, data, addresses, internal voltages, and so forth.

During the wafer test, a signal is applied to a semiconductor memory device by allocating channels of an external device to each pad. Therefore, if the number of pads is small, a greater number of devices can be simultaneously tested in one external device. On the contrary, the increase in number of pads inevitably causes a chip size to be increased.

SUMMARY OF THE INVENTION

Embodiments of the present invention are directed to providing a semiconductor memory device having an input device with small number of pads.

In one embodiment, a semiconductor memory device includes a pad configured to receive an external signal through a first external pin, a reference voltage pad configured to receive an external reference voltage through a second external pin, an internal reference voltage generator configured to generate an internal reference voltage using an external voltage in response to a reference voltage select signal, a reference voltage supply unit configured to generate the reference voltage select signal in response to a plurality of select signals, and select one reference voltage between the external reference voltage and the internal reference voltage to output the selected one as a selected reference voltage, a buffer configured to convert an output signal of the pad into an internal voltage level on the basis of the selected reference voltage, and a signal selector configured to control an internal signal to be inputted/outputted through the reference voltage pad in response to the plurality of select signals.

In another embodiment, a semiconductor memory device includes a pad configured to receive an external signal through a first external pin, a reference voltage pad configured to receive an external reference voltage through a second external pin, an internal reference voltage generator configured to generate a generation reference voltage using an external voltage, a reference voltage supply unit configured to select one of the external reference voltage and the internal reference voltage to output the selected one as a selected reference voltage in response to a plurality of select signals, a buffer configured to convert an output signal of the pad into an internal voltage level on the basis of the selected reference voltage, and a signal selector configured to control an internal signal to be inputted/outputted through the reference voltage pad in response to the plurality of select signals.

In still another embodiment, a semiconductor memory device includes a pad configured to receive a signal through a first external pin, a first reference voltage pad configured to receive a first external reference voltage through a second external pin, a second reference voltage pad configured to receive a second external reference voltage through a third external pin, a reference voltage supply unit configured to select one of the first and second external reference voltages to output the selected one as a selected reference voltage in response to a plurality of select signals, a first buffer configured to convert an output signal of the pad into an internal voltage level on the basis of the selected reference voltage, and a signal selector configured to control an internal signal to be inputted/outputted through the second reference voltage pad in response to the plurality of select signals.

DESCRIPTION OF SPECIFIC EMBODIMENTS

Hereinafter, a semiconductor memory device having an input device in accordance with the present invention will be described in detail with reference to the accompanying drawings.

Figure 2:
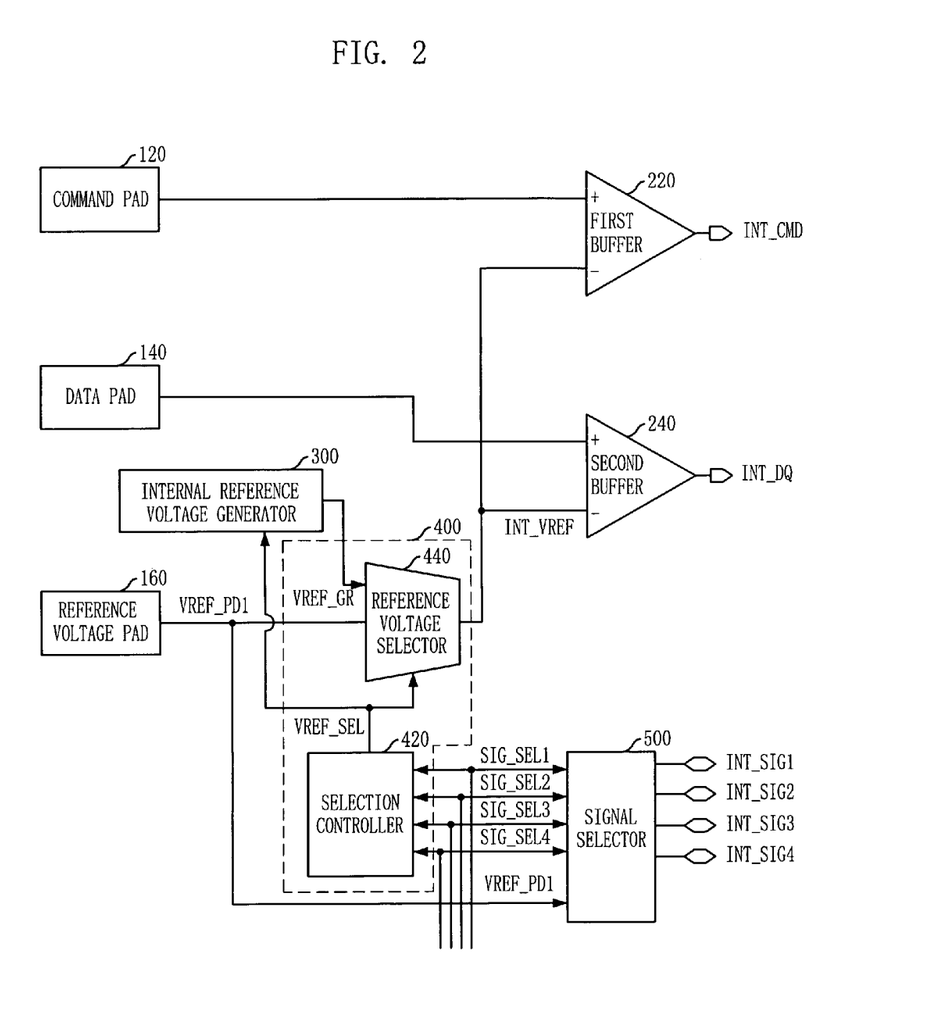
FIG. 2 illustrates a block diagram of a semiconductor memory device having an input device in accordance with a first embodiment of the present invention.

FIG. 2 illustrates a block diagram of a semiconductor memory device having an input device in accordance with a first embodiment of the present invention.

Referring to FIG. 2, the semiconductor memory device in accordance with the first embodiment includes a command pad 120, a data pad 140, a reference voltage pad 160, an internal reference voltage generator 300, a reference voltage supply unit 400, a first buffer 220, a second buffer 240 and a signal selector 500. The command pad 120 receives a command through an external pin. The data pad 140 inputs/outputs data through an external pin. The reference voltage pad 160 receives an external reference voltage VREF_PD1 through an external pin. The internal reference voltage generator 300 receives an external voltage VDD to generate an internal reference voltage VREF_GR. The reference voltage supply unit 400 generates a reference voltage select signal VREF_SEL in response to a plurality of select signals SIG_SEL1, SIG_SEL2, SIG_SEL3 and SIG_SEL4, and selects one reference voltage between the external reference voltage VREF_PD1 and the internal reference voltage VREF_GR to output the selected one as a reference voltage INT_VREF. The first buffer 220 converts the output signal of the command pad 110 into an internal command INT_CMD having an internal voltage level on the basis of the reference voltage INT_VREF. The second buffer 240 converts the output signal of the data pad 140 into an internal data INT_DQ having an internal voltage level on the basis of the reference voltage INT_VREF. The signal selector 500 inputs/outputs a signal through the reference voltage pad 160 in response to the plurality of select signals SIG_SEL1, SIG_SEL2, SIG_SEL3 and SIG_SEL4.

The reference voltage supply unit 400 includes a selection controller 420 and a reference voltage selector 440. The selection controller 420 receives the plurality of select signals SIG_SEL1, SIG_SEL2, SIG_SEL3 and SIG_SEL4 to generate the reference voltage select signal VREF_SEL. The reference voltage selector 440 outputs one reference voltage between the external reference voltage VREF_PD1 and the internal reference voltage VREF_GR as the reference voltage INT_VREF in response to the reference voltage select signal VREF_SEL.

The semiconductor memory device in accordance with the first embodiment further includes the internal reference voltage generator 300 configured to receive the external voltage VDD to internally generate the internal reference voltage VREF_GR, and the reference voltage supply unit 400 configured to select one reference voltage between the internal reference voltage VREF_GR and the external reference voltage VREF_PD1. Therefore, in the case where the reference voltage pad 160 is used for inputting/outputting an internal signal, the internally generated internal reference voltage VREF_GR is supplied as the reference voltage INT_VREF. In addition, the semiconductor memory device in accordance with the first embodiment includes the signal selector 500 so that the reference voltage pad 160 is used as a pad for inputting/outputting an internal signal during a wafer test.

For reference, the reference voltage is used as a reference value for determining logic levels of commands, addresses, data, etc, which are applied from the outside.

A schematic circuit of each block will be described in detail below.

Figure 3:
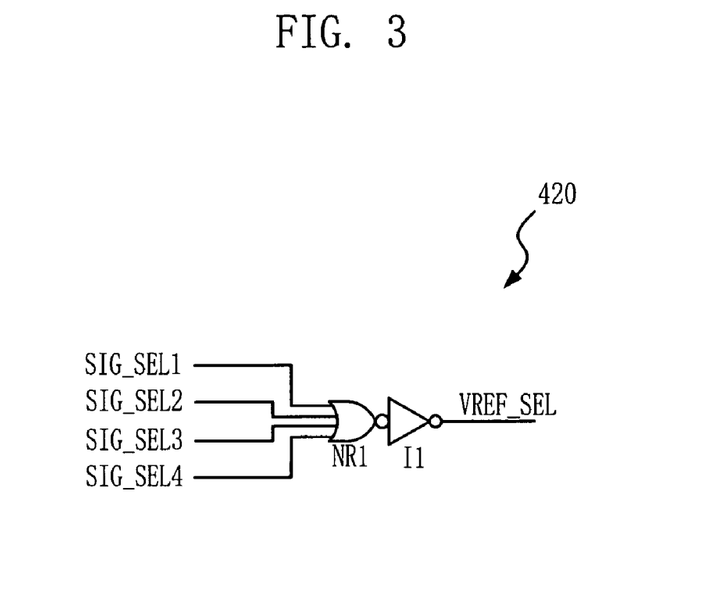
FIG. 3 illustrates a schematic circuit diagram of a selection controller described in FIG. 2.

FIG. 3 illustrates a schematic circuit diagram of the selection controller 420 described in FIG. 2.

Referring to FIG. 3, the selection controller 420 includes a NOR gate NR1 configured to perform a NOR operation on the plurality of select signals SIG_SEL1, SIG_SEL2, SIG_SEL3 and SIG_SEL4, and an inverter I1 configured to invert the output signal of the NOR gate NR1 to output the reference voltage select signal VREF_SEL. As for a driving mechanism of the selection controller 420, when any one of the plurality of select signals SIG_SEL1, SIG_SEL2, SIG_SEL3 and SIG_SEL4 is activated to a logic high level, the selection controller 420 activates the reference voltage select signal VREF_SEL to a logic high level.

Here, the plurality of select signals SIG_SEL1, SIG_SEL2, SIG_SEL3 and SIG_SEL4 control the input/output of an internal signal through the reference voltage pad 160. The plurality of select signals SIG_SEL1, SIG_SEL2, SIG_SEL3 and SIG_SEL4 are activated when the reference voltage pad 160 is used in a test mode. That is, when the reference voltage pad 160 is used for monitoring or applying the internal signals INT_SIG1, INT_SIG2, INT_SIG3 and INT_SIG3, it is impossible to receive the external reference voltage VREF_PD1. Therefore, the reference voltage select signal VREF_SEL is activated such that the internal reference voltage VREF_GR generated from the internal reference voltage generator 300 is selected instead of the external reference voltage VREF_PD1 and then supplied as the reference voltage INT_VREF.

Figure 4:
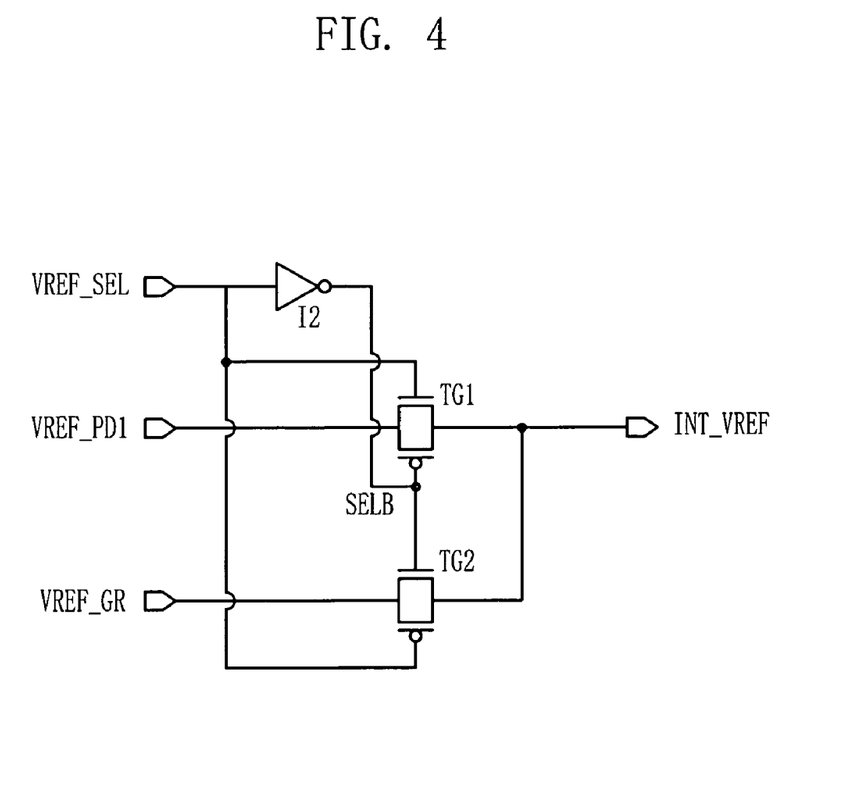
FIG. 4 illustrates a schematic circuit diagram of a reference voltage selector described in FIG. 2.

FIG. 4 illustrates a schematic circuit diagram of a reference voltage selector 440A described in FIG. 2.

Referring to FIG. 4, the reference voltage selector 440A includes an inverter I2, and transfer gates TG1 and TG2. The inverter I2 inverts the reference voltage select signal VREF_SEL to output a reference voltage select bar signal SELB. The first transfer gate TG1 outputs the external reference voltage VREF_PD1 as the reference voltage INT_VREF in response to the activations of the reference voltage select signal VREF_SEL and the reference voltage select bar signal SELB. The second transfer gate TG2 outputs the internal reference voltage VREF_GR as the reference voltage INT_VREF in response to the deactivations of the reference voltage select signal VREF_SEL and the reference voltage select bar signal SELB.

The driving mechanism of the reference voltage selector 440A will be described below. When the reference voltage select signal VREF_SEL and the reference voltage select bar signal SELB are activated to logic high level and low level, respectively, the reference voltage selector 440A outputs the external reference voltage VREF_PD1 as the reference voltage INT_VREF. On the contrary, when the reference voltage select signal VREF_SEL and the reference voltage select bar signal SELB are deactivated to logic low level and high level, respectively, the reference voltage selector 440A outputs the internal reference voltage VREF_GR as the reference voltage INT_VREF.

Figure 5:
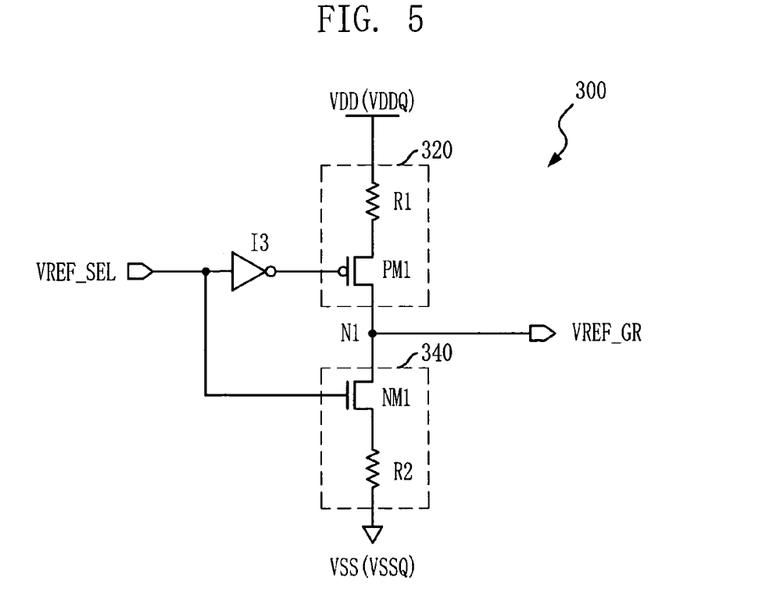
FIG. 5 illustrates a schematic circuit diagram of an internal reference voltage generator described in FIG. 2.

FIG. 5 illustrates a schematic circuit diagram of the internal reference voltage generator 300 described in FIG. 2.

Referring to FIG. 5, the internal reference voltage generator 300 includes an inverter I3 configured to invert the reference voltage select signal VREF_SEL, and a loading unit 320 and 340 configured to divide an external voltage VDD to output the internal reference voltage VREF_GR in response to the reference voltage select signal VREF_SEL and the output signal of the inverter I3.

The loading unit is provided with an uploading unit 320 and a downloading unit 340, and outputs a voltage of a node N1 as the internal reference voltage VREF_GR. Specifically, the uploading unit 320 includes a first resistor R1 of which one end is connected to a supply terminal of the external voltage VDD, and a PMOS transistor PM1 configured to receive the output signal of the inverter I3 through a gate thereof and have a source-drain path between the other end of the first resistor R1 and the node N1. The downloading unit 340 includes an NMOS transistor NM1 configured to receive the reference voltage select signal VREF_SEL through a gate thereof and have a drain terminal connected to the node N1, and a second resistor R2 connected between a source terminal of the NMOS transistor NM1 and a supply terminal of a ground voltage VSS.

When the reference voltage select signal VREF_SEL is activated to a logic high level, the uploading unit 320 and the downloading unit 340 are enabled so that the internal reference voltage generator 300 divide the external voltage VDD by a resistance ratio of the resistors R1 and R2 to thereby output the internal reference voltage VREF_GR.

Since the internal reference voltage generator 300 generates the internal reference voltage VREF_GR in response to the activation of the reference voltage select signal VREF_SEL, it is possible to prevent a short current from flowing to the ground voltage VSS terminal from the external voltage VDD terminal during a normal operation that does not require the internal reference voltage VREF_GR. Alternatively, the reference voltage generator 300 can be implemented without the MOS transistors PM1 and NM1 for enabling the uploading unit 320 and the downloading unit 340 according to the reference voltage select signal VREF_SEL, if necessary.

For reference, the reference voltage has a voltage level corresponding to the half voltage level of the external voltage VDD. A standard of the voltage level may be different in every specification of the semiconductor memory device, and based on Joint Electron Device Engineering Council (JEDEC) specification. For example, in a DDR2 SDRAM, the reference voltage is defined to have a voltage level ranging from 0.49×VDD to 0.51×VDD. Accordingly, the resistance ratio of the resistors R1 and R2 can be adjusted according to the specification.

Figure 6:
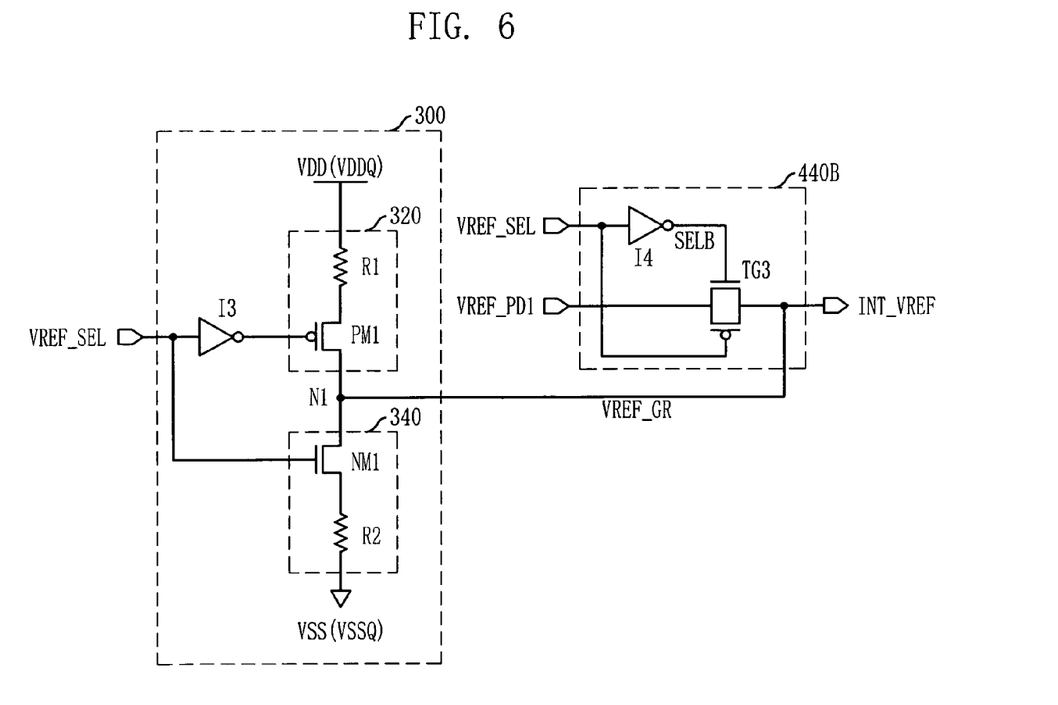
FIG. 6 illustrates a schematic circuit diagram of another embodiment of a reference voltage selector described in FIG. 2 shown together with the internal reference voltage generator.

FIG. 6 illustrates a schematic circuit diagram of another embodiment of a reference voltage selector described in FIG. 2 shown together with the internal reference voltage generator.

Referring to FIG. 6, the reference voltage selector 440B in accordance with another embodiment includes an inverter I4 and a transfer gate TG3. The inverter I4 inverts the reference voltage select signal VREF_SEL to output the reference voltage select bar signal SELB. The transfer gate TG3 outputs the external reference voltage VREF_PD1 as the reference voltage INT_VREF when the reference voltage select signal VREF_SEL and the reference voltage select bar signal SELB are deactivated to logic low level and high level, respectively. The transfer gate TG3 and the internal reference voltage generator 300 have a common output node N1.

For reference, the internal reference voltage generator 300 of FIG. 6 is the same as that of FIG. 5. It is merely illustrated to show that the internal reference voltage generator 300 and the reference voltage selector 440B have the common output node N1.

When the reference voltage select signal VREF_SEL is deactivated, the reference voltage selector 440B outputs the external reference voltage VREF_PD1, which is applied through the reference voltage pad 160, as the reference voltage INT_VREF. When the reference voltage select signal VREF_SEL is activated, the internal reference voltage generator 300 outputs the internal reference voltage VREF_GR. That is, since the external reference voltage VREF_PD1 is not outputted when the reference voltage select signal VREF_SEL is activated, the internal reference voltage VREF_GR is outputted as the reference voltage INT_VREF through the common output node N1.

Figure 7:
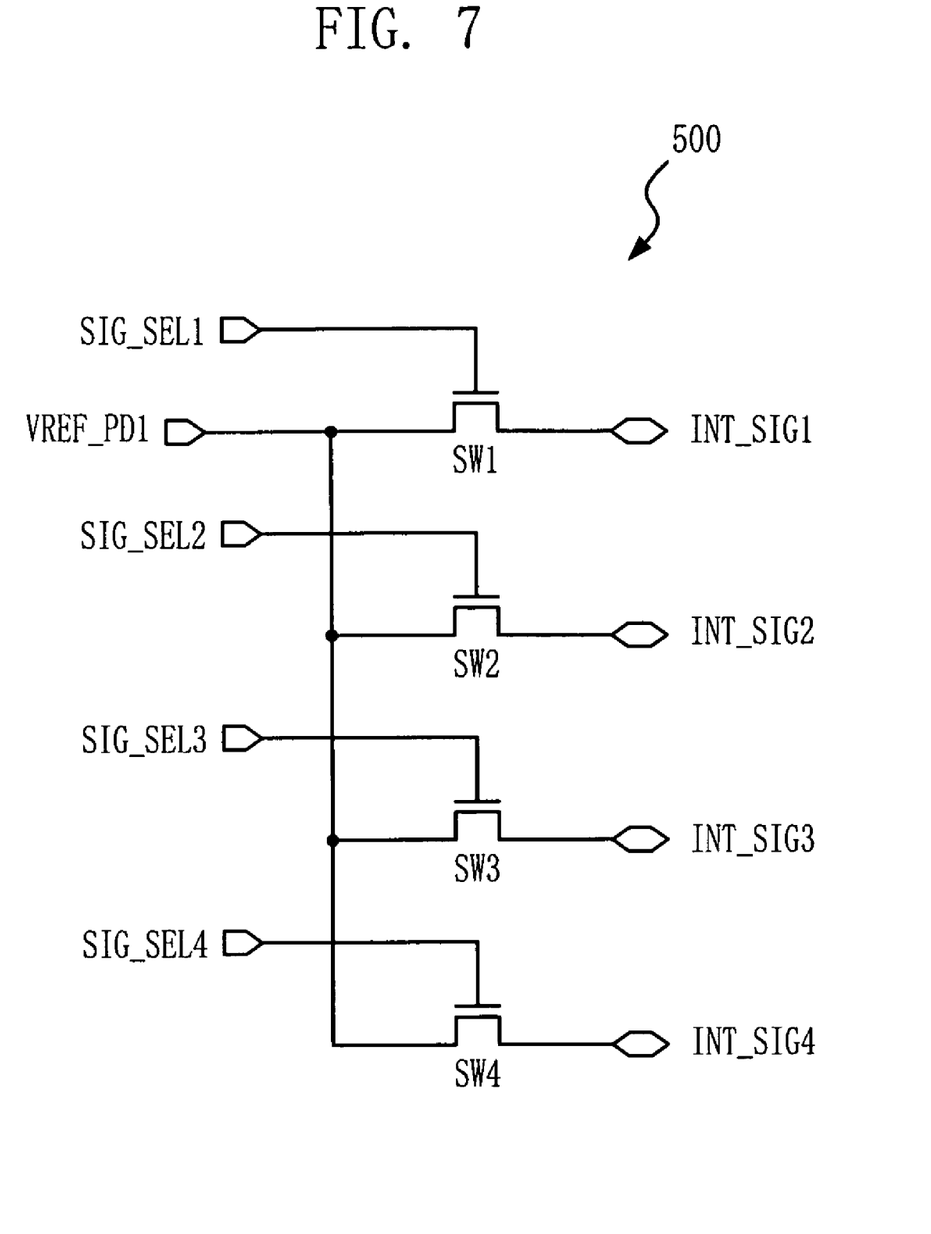
FIG. 7 illustrates a schematic circuit diagram of a signal selector described in FIG. 2

FIG. 7 illustrates a schematic circuit diagram of the signal selector 500 described in FIG. 2.

Referring to FIG. 7, the signal selector 500 includes a plurality of switches SW1, SW2, SW3 and SW4. The plurality of switches SW1, SW2, SW3 and SW4 are responsive to the plurality of select signals SIG_SEL1, SIG_SEL2, SIG_SEL3 and SIG_SEL4 to perform a switching operation between a node to which the external reference voltage VREF_PD1 is applied and a node to which corresponding internal signals INT_SIG1, INT_SIG2, INT_SIG3 and INT_SIG4 are applied.

When one of the plurality of select signals SIG_SEL1, SIG_SEL2, SIG_SEL3 and SIG_SEL4 is activated, the node for inputting/outputting the corresponding internal signal INT_SIG1, INT_SIG2, INT_SIG3 or INT_SIG4 is connected to the reference voltage pad 160 by a switching operation. For instance, when the select signal SIG_SEL1 is activated to a logic high level, the signal applied from the outside through the reference voltage pad 160 is outputted as the internal signal INT_SIG1. Alternatively, the internal signal INT_SIG1 can be detected at the outside through the reference voltage pad 160.

For reference, the plurality of select signals SIG_SEL1, SIG_SEL2, SIG_SEL3 and SIG_SEL4 are activated by the test mode controller in the semiconductor memory device. The test mode controller is activated in synchronization with an external mode register set (MRS) command.

Figure 8:
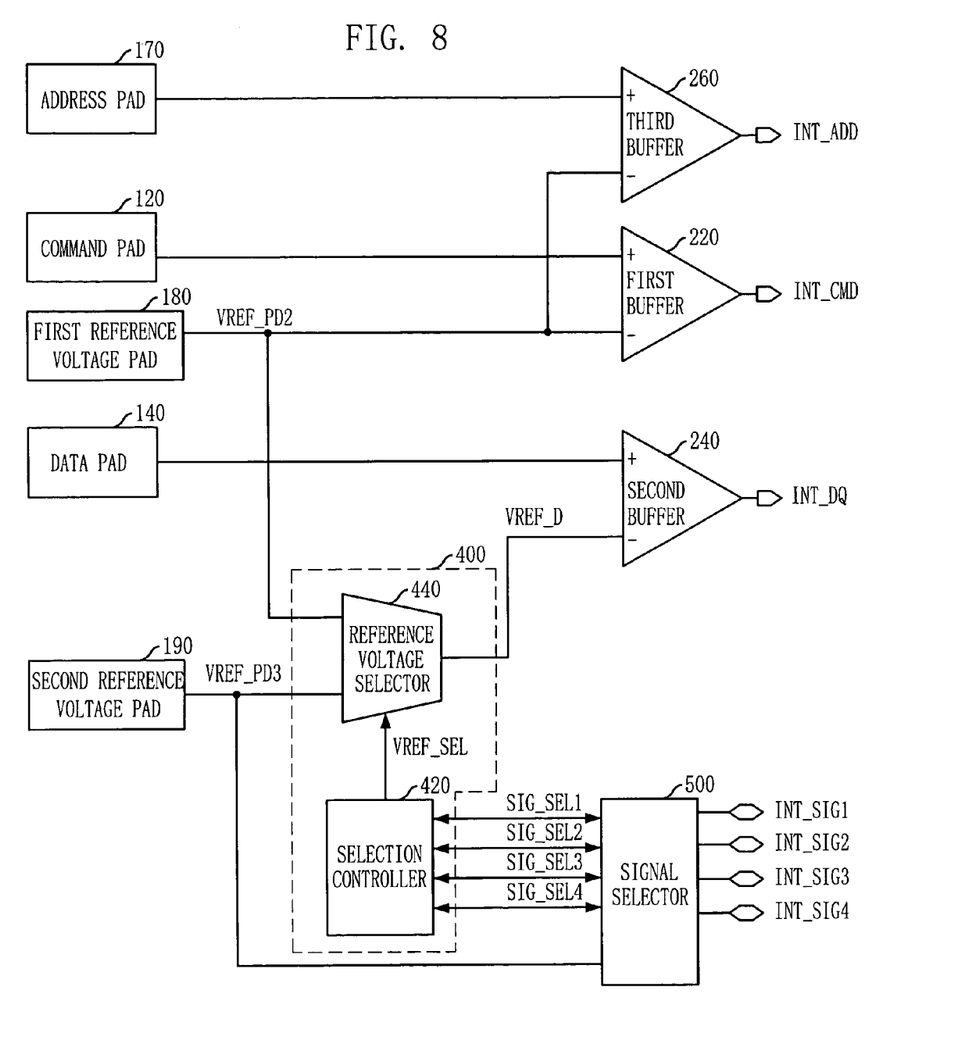
FIG. 8 illustrates a block diagram of a semiconductor memory device having an input device in accordance with a second embodiment of the present invention.

FIG. 8 illustrates a block diagram of a semiconductor memory device having an input device in accordance with a second embodiment of the present invention.

Referring to FIG. 8, the semiconductor memory device in accordance with the second embodiment includes a command pad 120, a data pad 140, an address pad 170, a first reference voltage pad 180, a second reference voltage pad 190, a reference voltage supply unit 400, a first buffer 220, a second buffer 240, a third buffer 260 and a signal selector 500. The command pad 120 receives a command through an external pin. The data pad 140 inputs/outputs data through an external pin. The address pad 170 inputs/outputs an address through an external pin. The first reference voltage pad 180 receives a first external reference voltage VREF_PD2 through an external pin. The second reference voltage pad 190 receives a second external reference voltage VREF_PD3 through an external pin. The reference voltage supply unit 400 selects one of the first and second external reference voltages VREF_PD2 and VREF_PD3 in response to the plurality of select signals SIG_SEL1, SIG_SEL2, SIG_SEL3 and SIG_SEL4, and outputs the selected reference voltage as the reference voltage INT_VREF. The first buffer 220 converts an output signal of the command pad 120 into an internal command INT_CMD having an internal voltage level on the basis of the first external reference voltage VREF_PD2. The second buffer 240 converts an output signal of the data pad 140 into internal data INT_DQ having an internal voltage level on the basis of the reference voltage INT_VREF. The third buffer 260 converts an output signal of the address pad 170 into internal address INT_ADD having an internal voltage level on the basis of the first external reference voltage VREF_PD2. The signal selector 500 inputs/outputs the internal signals through the second reference voltage pad 190 in response to the plurality of select signals SIG_SEL1, SIG_SEL2, SIG_SEL3 and SIG_SEL4.

In comparison with the semiconductor memory device of FIG. 2 in accordance with the first embodiment, it can be observed that the semiconductor memory device in accordance with the second embodiment includes two pads for receiving the reference voltages. In particular, the first external reference voltage VREF_PD2 applied through the first reference voltage pad 180 is used in the first and third buffers 220 and 260 that receive addresses or commands. The second external reference voltage VREF_PD3 applied through the second reference voltage pad 190 is used in the second buffer 240 that receives data. In the second embodiment, therefore, the internal reference voltage VREF_GR is not internally generated using the external voltage but the second reference voltage pad 190 is used for inputting/outputting the internal signal. That is, the semiconductor memory device of the second embodiment does not include the internal reference voltage generator (see 300 of FIG. 2) for generating the internal reference voltage VREF_GR.

For example, the semiconductor memory device of FIG. 8 may be a DDR3 SDRAM. In this case, the first external reference voltage VREF_PD2 that is used in monitoring the command and the address, and the second external reference voltage VREF_PD3 that is used in monitoring data are independently supported, respectively.

Particularly, the first external reference voltage VREF_PD2 is used in a buffer receiving various commands and addresses. A test mode is determined by combining the outputs of the buffer, and generally the plurality of select signals SIG_SEL1, SIG_SEL2, SIG_SEL3 and SIG_SEL4 are generated. Therefore, the first external reference voltage VREF_PD2 is used in the first and third buffer 220 and 260 it its entirety. However, because the second external reference voltage VREF_PD3 is used as a reference voltage for only data, the second buffer 240 may be driven using the first external reference voltage VREF_PD2 according to the selection, and the second reference voltage pad 190 is used for inputting/outputting the internal signals INT_SIG1, INT_SIG2, INT_SIG3 and INT_SIG4.

Therefore, in accordance with the semiconductor memory device of the first and second embodiments, it is possible to use some external pins, which are generally used under a finished product, for monitoring or applying the internal signal during the test mode. That is, a plurality of conventional pads, which were to be provided for monitoring or applying the plurality of internal signals, can be removed in the present invention, thus reducing a chip size in the semiconductor memory device. Additionally, since a specific internal signal can be monitored or applied through an external pin even after the device has been packaged, it is easy to find defects of the semiconductor memory device during a test after it is packaged, which makes it possible to reduce a development period of the finished product. In addition, it is possible to test more chips in parallel at a time because the number of pads required during the test is reduced and thus a small number of test device channels is required. This also makes it possible to reduce a test time on the whole.

As described above, in accordance with the present invention, an internal signal can be monitored or applied through an external pin even after the device has been packaged, thus facilitating a testing of products and shortening a development period. Furthermore, it is possible to reduce the number of pads for monitoring the internal signal, making it possible to reduce a chip size.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a pad configured to receive an external signal through a first external pin;
    a reference voltage pad configured to receive an external reference voltage through a second external pin;
    an internal reference voltage generator configured to generate an internal reference voltage using an external voltage in response to a reference voltage select signal;
    a reference voltage supply unit configured to generate the reference voltage select signal in response to a plurality of select signals, and select one reference voltage between the external reference voltage and the internal reference voltage to output the selected one as a selected reference voltage;
    a buffer configured to convert an output signal of the pad into an internal voltage level on the basis of the selected reference voltage; and
    a signal selector configured to control an internal signal to be inputted/outputted through the reference voltage pad in response to the plurality of select signals.

2. The semiconductor memory device as recited in claim 1, wherein the reference voltage supply unit includes:
    a selection controller configured to generate the reference voltage select signal in response to the plurality of select signals; and
    a reference voltage selector configured to output one of the external reference voltage and the internal reference voltage as the selected reference voltage in response to the reference voltage select signal.

3. The semiconductor memory device as recited in claim 1, wherein the internal reference voltage generator includes:
    an inverter configured to invert the reference voltage select signal; and
    a loading unit configured to output the internal reference voltage by dividing the external voltage in response to the reference voltage select signal and an output signal of the inverter.

4. The semiconductor memory device as recited in claim 3, wherein the loading unit includes:
    an uploading unit provided with a first resistor of which one end is connected to an external voltage terminal, and a PMOS transistor configured to receive the output signal of the inverter through a gate thereof and having a source-drain path between the other end of the first resistor and a first node; and
    a downloading unit provided with an NMOS transistor configured to receive the reference voltage select signal through a gate thereof and having a drain terminal connected to the first node, and a second resistor connected between a source terminal of the NMOS transistor and a ground voltage terminal,
    wherein the loading unit outputs a voltage of the first node as the internal reference voltage.

5. The semiconductor memory device as recited in claim 2, wherein the selection controller includes:
    a NOR gate configured to perform a NOR operation on the plurality of select signals; and
    an inverter configured to invert an output signal of the NOR gate to output the reference voltage select signal.

6. A semiconductor memory device, comprising:
- a pad configured to receive an external signal through a first external pin;
- a reference voltage pad configured to receive an external reference voltage through a second external pin;
- an internal reference voltage generator configured to generate a generation reference voltage using an external voltage;
- a reference voltage supply unit configured to select one of the external reference voltage and the internal reference voltage to output the selected one as a selected reference voltage in response to a plurality of select signals;
- a buffer configured to convert an output signal of the pad into an internal voltage level on the basis of the selected reference voltage; and
- a signal selector configured to control an internal signal to be inputted/outputted through the reference voltage pad in response to the plurality of select signals.

7. The semiconductor memory device as recited in claim 6, wherein the reference voltage supply unit includes:
- a selection controller configured to generate the reference voltage select signal in response to the plurality of select signals; and
- a reference voltage selector configured to output one of the external reference voltage and the internal reference voltage as the selected reference voltage in response to the reference voltage select signal.

8. The semiconductor memory device as recited in claim 6, wherein the internal reference voltage generator includes:
- an inverter configured to invert the reference voltage select signal; and
- a loading unit configured to output the internal reference voltage by dividing an external voltage in response to the reference voltage select signal and the output signal of the inverter.

9. The semiconductor memory device as recited in claim 8, wherein the loading unit includes first and second resistors connected in series between an external voltage terminal and a ground voltage terminal,
- the loading unit outputting a voltage of a connection node between the first and second resistors as the internal reference voltage.

10. The semiconductor memory device as recited in claim 7, wherein the selection controller includes:
- a NOR gate configured to perform a NOR operation on the plurality of select signals; and
- an inverter configured to invert an output signal of the NOR gate to output the reference voltage select signal.

11. The semiconductor memory device as recited in claim 7, wherein the reference voltage selector includes:
- an inverter configured to invert the reference voltage select signal to output a reference voltage select bar signal;
- a first transfer gate configured to output the external reference voltage as the selected reference voltage in response to the activations of the reference voltage select signal and the reference voltage select bar signal; and
- a second transfer gate configured to output the internal reference voltage as the selected reference voltage in response to the deactivations of the reference voltage select signal and the reference voltage select bar signal.

12. The semiconductor memory device as recited in claim 6, wherein the signal selector includes a plurality of switches responsive to the plurality of select signals to perform a switching operation between the reference voltage pad and a node to which a corresponding internal signal is applied.

13. The semiconductor memory device as recited in claim 7, wherein the reference voltage selector includes:
- an inverter configured to invert the reference voltage select signal to output a reference voltage select bar signal; and
- a first transfer gate configured to output the external reference voltage as the selected reference voltage when the reference voltage select signal and the reference voltage select bar signal are deactivated,
- wherein the first transfer gate and the internal reference voltage generator have a common output node.

14. The semiconductor memory device as recited in claim 6, wherein the signal selector includes a plurality of switches responsive to the plurality of select signals to perform a switching operation between the reference voltage pad and a node to which a corresponding internal signal is applied.

15. A semiconductor memory device, comprising:
- a pad configured to receive a signal through a first external pin;
- a first reference voltage pad configured to receive a first external reference voltage through a second external pin;
- a second reference voltage pad configured to receive a second external reference voltage through a third external pin;
- a reference voltage supply unit configured to select one of the first and second external reference voltages to output the selected one as a selected reference voltage in response to a plurality of select signals;
- a first buffer configured to convert an output signal of the pad into an internal voltage level on the basis of the selected reference voltage; and
- a signal selector configured to control an internal signal to be inputted/outputted through the second reference voltage pad in response to the plurality of select signals.

16. The semiconductor memory device as recited in claim 15, further comprising:
- a command pad configured to receive a command through a fourth external pin;
- an address pad configured to receive an address through a fifth external pin;
- a second buffer configured to convert an output signal of the command pad into an internal voltage level on the basis of the first external reference voltage; and
- a third buffer configured to convert an output signal of the address pad into an internal voltage level on the basis of the first external reference voltage.

17. The semiconductor memory device as recited in claim 15, wherein the reference voltage supply unit includes:
- a selection controller configured to generate the reference voltage select signal in response to the plurality of select signals to; and
- a reference voltage selector configured to output one of the first and second external reference voltages as the selected reference voltage in response to the reference voltage select signal.

18. The semiconductor memory device as recited in claim 17, wherein the selection controller includes:
- a NOR gate configured to perform a NOR operation on the plurality of select signals; and
- an inverter configured to invert an output signal of the NOR gate to output the reference voltage select signal.

19. The semiconductor memory device as recited in claim 17, wherein the reference voltage selector includes:
- an inverter configured to invert the reference voltage select signal to output a reference voltage select bar signal;

a first transfer gate configured to output the first external reference voltage as the selected reference voltage in response to the activations of the reference voltage select signal and the reference voltage select bar signal; and a second transfer gate configured to output the second external reference voltage as the selected reference voltage in response to the deactivations of the reference voltage select signal and the reference voltage select bar signal.

20. The semiconductor memory device as recited in claim 15, wherein the signal selector includes a plurality of switches responsive to the plurality of select signals to perform a switching operation between the reference voltage pad and a node to which a corresponding internal signal is applied.

* * * * *